United States Patent
Jain et al.

(10) Patent No.: US 7,356,426 B2
(45) Date of Patent: Apr. 8, 2008

(54) CALIBRATION OF THERMAL SENSORS FOR SEMICONDUCTOR DIES

(75) Inventors: Sandeep Jain, Milpitas, CA (US); Animesh Mishra, Pleasanton, CA (US); Jun Shi, San Jose, CA (US); Pochang Hsu, Fremont, CA (US); David Wyatt, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 577 days.

(21) Appl. No.: 10/955,154

(22) Filed: Sep. 30, 2004

(65) Prior Publication Data
US 2006/0066384 A1   Mar. 30, 2006

(51) Int. Cl.
*G01K 7/00* (2006.01)
*G01K 7/01* (2006.01)
*G06F 19/00* (2006.01)
*G11C 7/04* (2006.01)
*H03K 17/14* (2006.01)

(52) U.S. Cl. .................. 702/99; 702/130; 702/132; 374/1; 374/141; 374/152; 365/212; 327/378; 327/512

(58) Field of Classification Search .............. 702/99, 702/130, 132; 327/378, 512; 365/212; 374/1, 374/141, 152
See application file for complete search history.

(56) References Cited

U.S. PATENT DOCUMENTS

| | | | | | |
|---|---|---|---|---|---|
| 5,798,667 | A | * | 8/1998 | Herbert | 327/573 |
| 6,779,736 | B1 | * | 8/2004 | Lorenz | 236/91 G |
| 6,837,441 | B1 | * | 1/2005 | Lorenz | 236/79 |
| 6,924,758 | B1 | * | 8/2005 | Lorenz | 341/144 |
| 6,974,252 | B2 | * | 12/2005 | Bowden et al. | 374/163 |
| 7,145,823 | B2 | * | 12/2006 | Jain et al. | 365/211 |
| 2004/0003301 | A1 | * | 1/2004 | Nguyen | 713/300 |
| 2004/0128101 | A1 | * | 7/2004 | Hermerding, II | 702/136 |
| 2004/0179576 | A1 | * | 9/2004 | Bowden et al. | 374/163 |
| 2005/0261866 | A1 | * | 11/2005 | Boerstler et al. | 702/130 |
| 2006/0029122 | A1 | * | 2/2006 | Bowden et al. | 374/170 |

* cited by examiner

*Primary Examiner*—Evan Pert
(74) *Attorney, Agent, or Firm*—Blakely, Sokoloff, Taylor & Zafman LLP

(57) ABSTRACT

A thermal management system is described which may be implemented on a semiconductor die. The system may include a thermal sensor thermally coupled to the die to sense the temperature of the die and generate an output representing the sensed temperature, and an adjustable compensation circuit coupled to the thermal sensor to compensate the thermal sensor output. The adjustable compensation circuit may be applied to the thermal sensor or to a threshold.

25 Claims, 6 Drawing Sheets

CALIBRATION OF THERMAL SENSORS FOR SEMICONDUCTOR DIES

BACKGROUND

1. Field

Embodiments of the present invention relate to sensing temperatures on integrated circuits and, in particular, to a thermal detection circuit with adjustable calibration settings.

2. Background

Integrated circuits (ICs) generate heat when powered by an electric source such as a power supply. ICs are generally susceptible to overheating which may cause the IC or the device in which the IC is employed to fail, to malfunction, to be uncomfortable for the user to handle, or to otherwise diminish the utility of the IC or the device. Controlling excess heating in ICs is becoming a more serious problem as more powerful and more complex ICs are packaged in smaller and lighter IC packages. For example, computers are steadily increasing the amount and density of memory within the microprocessor, in the system memory and on various add-in cards. Increases in clock speeds and device activity combined with increases in the number and density of devices in one chip further increase the heating of the devices.

Thermal management is used to prevent the IC and the device in which the IC is employed from overheating. A variety of thermal management devices and techniques have been employed to attempt to prevent ICs from overheating. These devices include fans, fins, and liquid cooling pipes that draw heat away from the IC to a radiator. Some thermal management devices adjust the duty cycle by, for example, reducing clock speeds or input and output rates or voltages to reduce the temperature. All of these approaches have some negative effect. The effect may be in cost, size, noise, power consumption or reduced performance.

When the temperature is sensed directly, then fans or duty cycle adjustments may be applied in response to the sensed temperature. As a result, some of the negative impacts may be reduced. If the IC is running cool, then fans, coolers or duty cycle adjustments can be turned off, saving power and increasing performance. The more accurate the temperature measurement, the more accurate the use of the thermal management devices may be. This allows, for example, the fan to be turned on only when absolutely necessary, reducing noise and power consumption. The more accurate the thermal sensor, the more accurate the control may be.

DESCRIPTION OF THE DRAWINGS

Embodiments of the present invention will be understood more fully from the detailed description given below and from the accompanying drawings of various embodiments of the invention. The drawings, however, should not be taken to be limiting, but are for explanation and understanding only. In the drawings.

DETAILED DESCRIPTION

Figure 1:
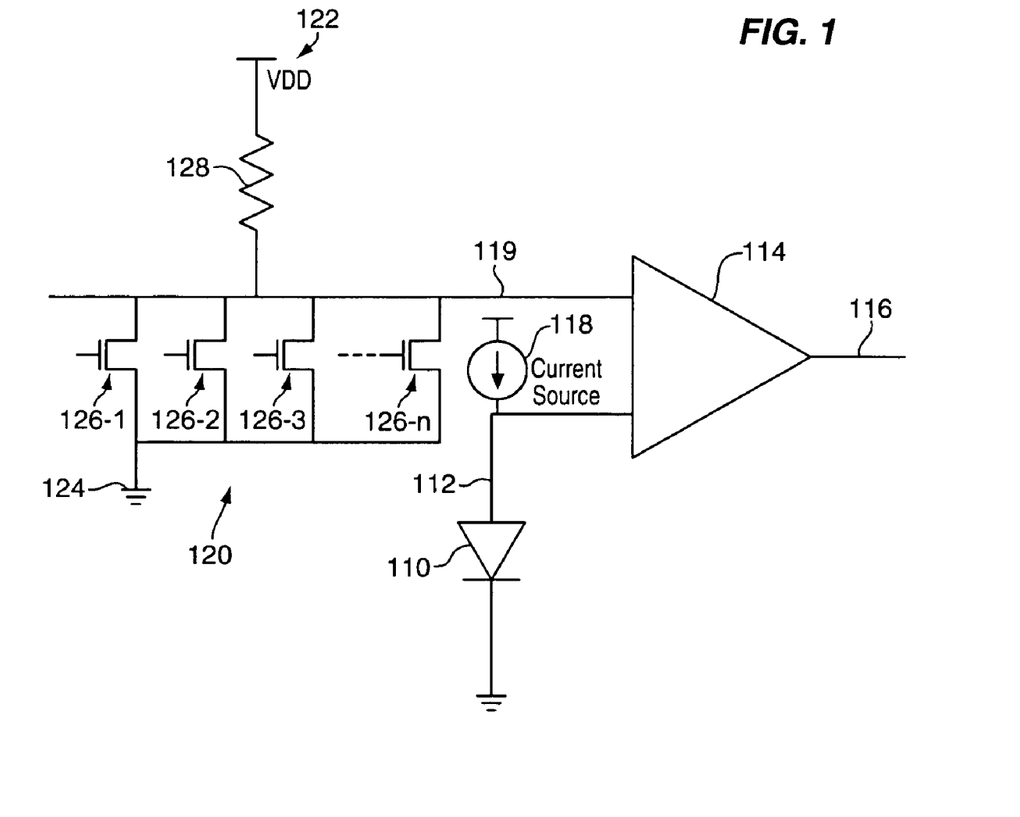
FIG. 1 is a circuit diagram of a thermal sensor with an adjustable reference voltage circuit according to an embodiment of the invention.

FIG. 1 shows a thermal sensor configuration adapted for use with DDR3 DRAM (Double Data Rate, Third Generation, Dynamic Random Access Memory) dies. However, it may also be applied to any other Integrated Circuit (IC) chip. In the illustrated thermal sensor, one or more thermal diodes 110 produce a voltage 112 that changes with the temperature around it. The thermal diode may be embedded in the die in an area of the die that is likely to overheat or it may be applied to a surface of the die. The diode may also be applied to the die substrate proximate thermal or electrical planes of the die substrate. Alternatively, diodes may be placed in different thermally sensitive or thermally responsive locations of the die. The results from different diodes may be combined or the voltage of each diode may be analyzed independently to ensure that no area of the die suffers a thermal breakdown. As an alternative, other thermally sensitive voltage devices may be used, including transistors and resistors.

A diode is commonly used as a thermal sensing device because it can be fabricated to have a voltage drop which is proportional to temperature. Normally a diode's voltage drop increases as temperature increases. The voltage across a diode may be represented by the following equation:

$$V = (KT/Q)(\ln(I/Is))$$

where V is the voltage across the diode, K is Boltzmann's constant, T is temperature, Q is electric charge, ln is the natural logarithm, I is the current through the diode, and Is is the saturation current for the diode. In this equation, K is fixed and Q and Is are determined by the physical dimensions of the particular diode. The only variables are T, the temperature to be measured and I which is provided by the stabilized current source 118. Therefore, as long as I is stable, V will change as a function of T.

The saturation current (Is) is given by Is=kA, where k is a constant and A is the area of the junction of the diode. Accordingly, saturation current (Is) is constant for any one diode and is determined by its physical dimensions. In addition, the feature of the diode which provides the thermal response is the p-n junction that determines the saturation current. Any other device that includes a p-n junction, for example a transistor, or an amplifier, or a logic gate, may be used in the same way as a thermal diode with appropriate adjustments to the surrounding circuitry. While a thermal diode is shown in FIG. 1, any other thermally sensitive device may be used.

The diode is powered by a stabilized current source 118. The current source is coupled to VDD and is designed to produce a consistent current flow to the diode regardless of changes in temperature and supply voltage. Any of a variety of different current source circuits may be used. In one example, a current mirror based current source may be used in which a bandgap reference technique controls the voltage and temperature variations on the silicon.

The thermal sensor also has a comparator 114. The thermal diode's voltage output 112 is applied as a first input to the comparator. The other input to the comparator is a reference trip voltage 119. The comparator produces a trip signal 116. In one embodiment, the comparator can assert the trip signal if the diode's thermal voltage exceeds the trip voltage 119. Since the thermal diode's output is directly related to its sensed temperature, the trip signal is generated if the temperature measured by the thermal diode exceeds the temperature represented by the trip voltage. The trip voltage accordingly serves as an adjustable temperature threshold. Adjusting the trip voltage, changes the temperature at which the trip signal is generated.

The trip signal may be applied to a thermal management system (not shown) to actuate a fan, or other cooler or to reduce the chip's duty cycle. In a memory chip, the trip signal may trigger a software routine or set a parameter that will reduce the speed at which the memory is accessed. Alternatively, the trip signal may be used to slow memory accesses or to defer memory accesses to a different memory chip. The trip signal may also be used to generate a warning signal to a user. At extremely high temperatures, the trip signal may be used to shut off access to the chip or to shut down the associated system.

The trip voltage may be generated by an accurate push-pull network 120 coupled between VDD 122 and ground 124. In the example of FIG. 1, the push pull network is made up of a sequence of individual NMOS (Negative channel Metal Oxide Semiconductor) transistors 126-1, 126-2, 126-3, . . . 126-n. The number of transistors may be selected to suit any particular application. A DDR3 DRAM may have 20 to 50 transistors, or any other number. Each transistor is coupled at its source through a resistor 128 to VDD, to the sources of the other transistors the trip reference voltage input of the comparator. Each transistor is coupled at 124 and to the drains of the other transistors.

The gates of the push-pull network transistors can be controlled by a calibration circuit to enable or disable each transistor as a pull-down leg between the trip reference voltage and ground. In one embodiment, each leg may provide about 1 KOhm of resistance, however, the particular values for each leg may be adapted to suit any particular implementation. As more pull-down legs are switched on, the impedance of the resistor network through the common resistor 128 changes so that the trip voltage is reduced. This allows the trip voltage to be calibrated based on the performance of the thermal diode and of the die. The common resistor may be based on an ideal current source, a well calibrated PMOS (Positive channel Metal Oxide Semiconductor) device, or a variety of other devices.

The reference trip voltage may be adjusted by opening or closing the gates of the push-pull network 120. Two factors that may be used to determine the adjustment are the manufacturing variations specific to each die and the desired threshold temperature at which a trip signal should be generated. Other factors may also be calibrated for including variations in the thermal diode, current sources, power supplies, transmission paths, etc.

The manufacturing variations may be measured by comparing the reference voltage to a standard and developing a manufacturing offset value (MfgOffset) that may be stored in an internal register of the die. It may be stored in the format of some number of legs of the push-pull network that, if closed, would compensate for the manufacturing variation. As an alternative to storing the manufacturing offset in a register, it may be compensated by laser trimming or by fusing the gates of some of the transistors of the push-pull network.

The manufacturing offset may compensate for variations in the push-pull network, the voltage and current sources, the thermal diode or any other components of the thermal sensing system. It may be measured, for example, by comparing thermal system readings to high precision readings around a junction or on the case of the die. Any of a variety of different electrical or optical precision temperature measurement systems may be used including mechanical probes.

Figure 2:
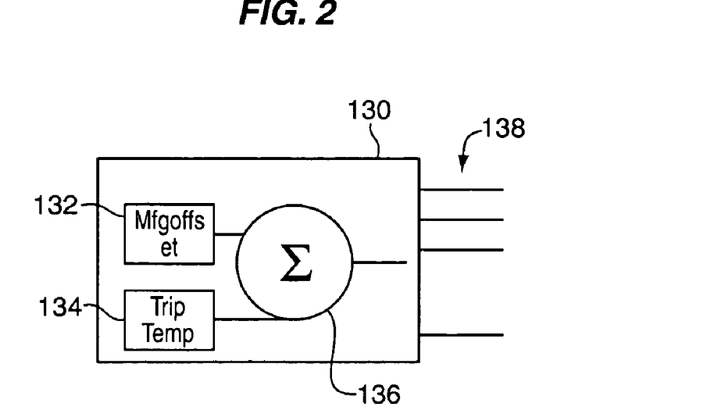
FIG. 2 is a conceptual block diagram of correction factors applied to embodiments of the present invention.

The trip temperature may be a fixed value stored in a register or known to the manufacturer. It may also be a parameter that a user may set to accommodate performance or control objectives. FIG. 2 diagrammatically indicates that the value of the manufacturing offset 132 and the trip temperature 134 may be combined 136 to determine how many legs of the push-pull network to close 138. Other factors, not shown in FIG. 2, may also be combined for the final determination.

To calibrate the reference trip voltage, a look-up table may be used, similar to Table 1. In Table 1, different temperatures in the first column correspond to different reference trip voltages in the second column and, accordingly, different numbers of NMOS legs in the push-pull network in the third column. Each row shows how many legs to enable or disable to achieve a particular trip voltage and corresponding temperature.

TABLE 1

| Temperature (° C.) | Vreftrip (V) | Legs |
|---|---|---|
| T1 | V1 | 0 |
| T2 | V2 | 1 |
| T3 | V3 | 2 |
| T4 | V4 | 3 |
| T5 | V5 | 4 |
| T6 | V6 | 5 |
| . | . | . |
| . | . | . |
| . | . | . |

The temperatures may correspond to the temperature of the die's case, a selected junction or the sensing junction of the thermal diode. Such a table may be used by a manufacturer in configuring the die or by a user in selecting from among different temperatures. Table 1 shows that each temperature corresponds to a particular reference trip voltage. Each reference trip voltage corresponds to a different number of pull-down legs in the reference trip voltage generator. By selecting a particular number of legs, the comparator may be induced to generate a trip signal at any one of a variety of different temperatures.

While only one reference trip voltage is described herein, additional reference voltage generators may be input to additional or more complex comparators so that additional trip signals may be provided as the IC reaches different temperatures. The signals may be differentiated so that different levels of response or warning may be provided. For example, when the temperature passes a first threshold, then a fan might be switched on. If the voltage passes a second threshold, then the duty cycle of the IC may be reduced. If the temperature passes a third threshold, then the IC may be shut down to avoid catastrophic failure.

Figure 3:
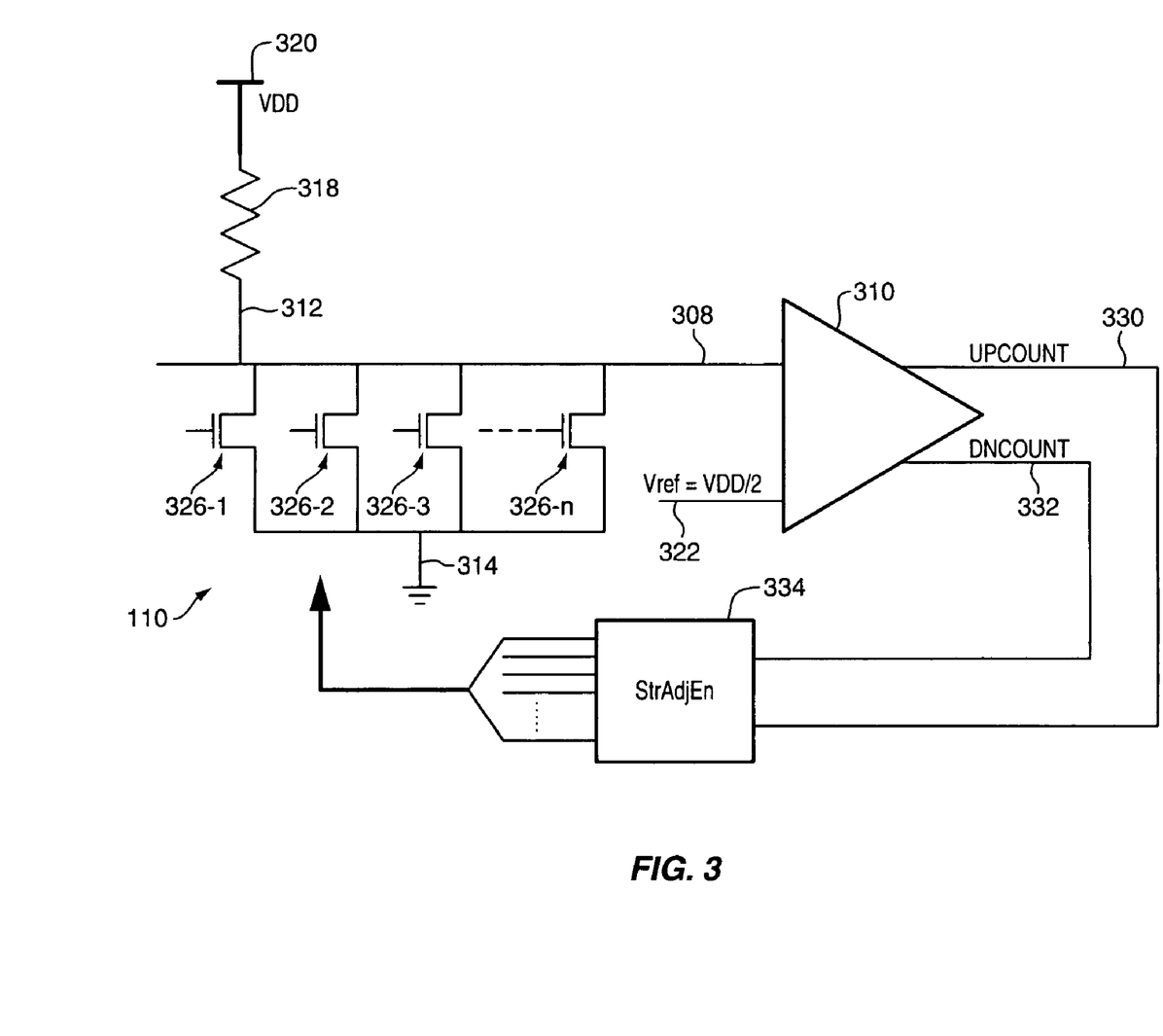
FIG. 3 is a circuit diagram of a thermal sensor with an adjustable diode thermal junction circuit according to an embodiment of the invention.

FIG. 3 shows a more detailed view of one embodiment of the thermal diode 110 and some additional components that may be used to calibrate the thermal diode. In FIG. 3, the thermal diode includes several NMOS legs of a transistor push-pull network, 326-1, 326-2, 326-3, . . . 326-n. The transistors are coupled at their sources to each other, to a first input 308 of a comparator 310, and to an external pin 312. The transistors are coupled at their drains to each other and to ground 314. The gates of the transistors may be selected as opened or closed in order to calibrate the effective size of the diode's thermal junction, thereby calibrating the diode.

The external pin may be any pin of the IC. For a DDR3 DRAM the ZQ pin may be used as the external pin 312, but other pins may be used for DRAM as well as for other IC's.

For DDR3, the ZQ pin is already defined for calibrating the output drivers of I/O (Input/Output) buffers and may be readily adapted to the purposes described with respect to FIG. 3. In the example of FIG. 3, the external pin is coupled through a precision resistor 318 to VDD. This connection is switchable so that it may be enabled for calibration and disabled for temperature measurements. As shown in FIG. 1, the thermal diode is also coupled to a precision current source for measuring the temperature of the IC. This connection may be disconnected during calibration.

In the calibration configuration of FIG. 3, the diode legs act as pull-down transistors for the supplied VDD. The reduced voltage is supplied to the comparator 310. The comparator compares the pulled down voltage to a reference voltage input. The reference voltage may be generated by a precision voltage divider coupled to VDD, by a differential amplifier, or by a variety of other circuits. The voltage generator may be designed to provide any level of precision desired for the particular application. In one embodiment, external precision resistors may be used so that the voltage is not subject to temperature and process variations on the die The comparator produces an upcount signal 330, or a downcount signal 334, depending upon whether the diode voltage is higher or lower than the reference voltage. The output signal is applied to a strength adjustment enable block 334. This block is a simple logic block that opens or closes gates of the transistor network until the diode is calibrated. In one embodiment, there are 10 or 20 diode legs each providing about 1 K Ohm. The calibration can therefore be adjusted to within plus or minus 0.5 K Ohms. The diode legs may be maintained in an on or off state using parameter settings, dedicated registers, or by designing the diode legs to hold a designated state until the next calibration cycle. In an initial calibration cycle, legs of the diode may be fused to establish a baseline calibration.

The precision resistor 318 and calibration circuitry may be provided on a test fixture that accesses the die in a manufacturing or calibration cycle. This reduces the size and cost of the die. Alternatively, all of the circuitry of FIG. 3 may be integrated on the die and a controller on the die may autonomously drive calibration cycles according to a programmed scheduling routine. While the precision resistor and related circuitry add to expense and complexity, higher accuracy may be ensured by frequent calibration cycles.

With recurring diode calibration cycles, variations in VDD may be compensated for. In some embodiments in which the reference voltage is derived from VDD, variations in the VDD may also change the reference voltage so that the calibration automatically compensates for such fluctuations. In many IC's, the calibration cycle may be repeated by the IC autonomously. This allows changes in the circuit over time as well as changes in operating parameters to be compensated for. In a DDR3 DRAM, for example, a controller integrated into the die manages many different functions. Calibration may be added to such functions by providing a precision resistor and access to the ZQ pin.

In the description above, two independent calibration systems are described. The reference trip voltage and the thermal diode junction area may both be calibrated. The reference trip voltage calibration adjusts one input of the comparator of FIG. 1 and the thermal diode calibration adjusts the other input of the comparator of FIG. 1. In some applications it may be preferred to adjust only the reference trip voltage, and in other applications it may be preferred to adjust only the thermal diode voltage. In still other applications both may be adjusted. Either input or both inputs to the comparator may be used to calibrate for all of the variables described above by making a few modifications to the described calibration cycles.

In addition, either one of the described calibration cycles may be performed on the die by a controller circuit integrated on the die or by external test equipment or both. In the embodiment described above, the trip voltage is calibrated using external test equipment at a manufacturing or test facility. The particular trip voltage temperature is selected by the user or by an external application. The thermal diode on the other hand is calibrated on the die according to a maintenance schedule. As an alternative, both calibrations may be performed autonomously on the die, under control of an external system processor or by external test equipment only. The particular choice for running calibration cycles will depend upon the particular application for the system.

Figure 4:
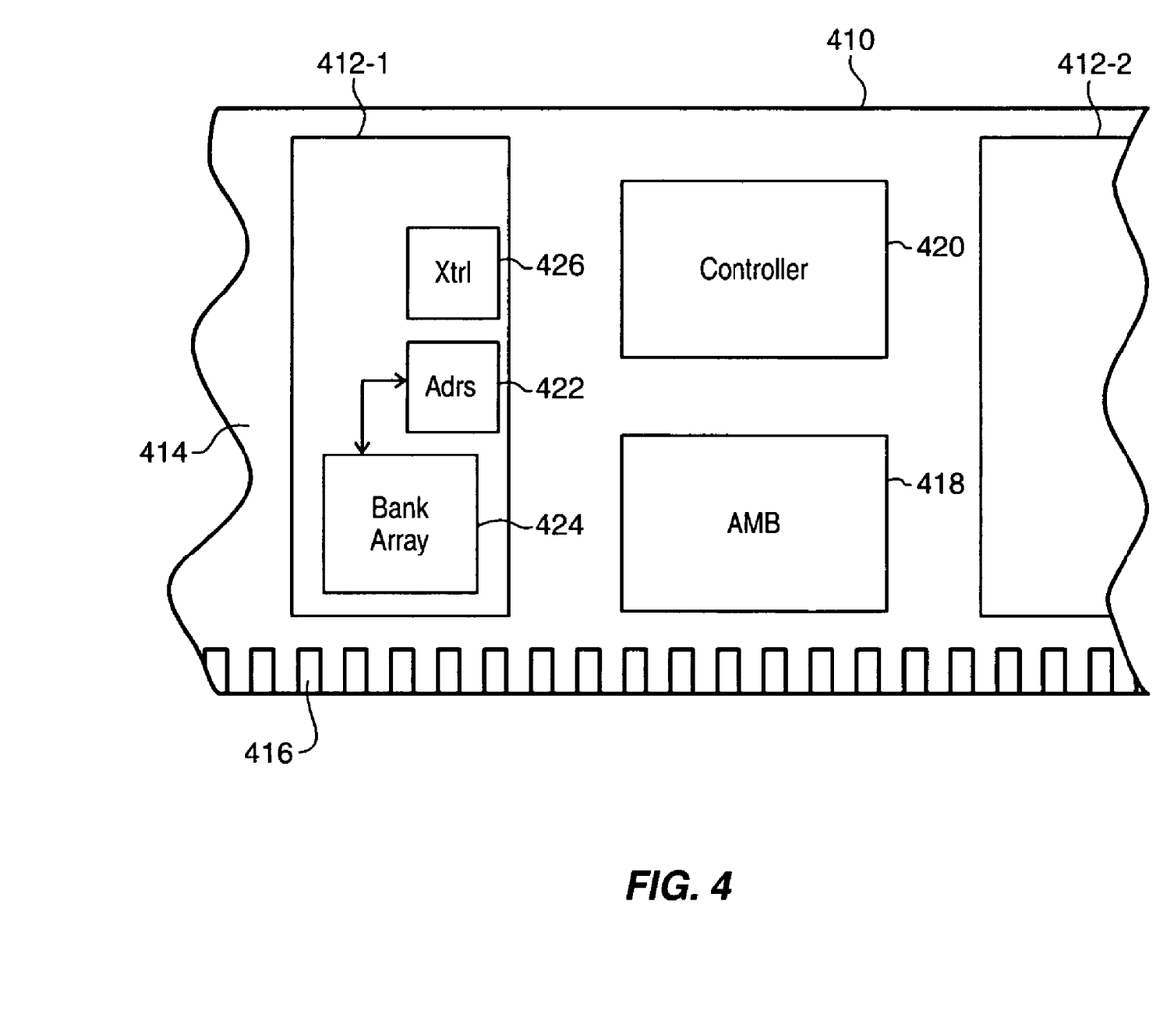
FIG. 4 is a block diagram of a memory system suitable for use with embodiments of the present invention.

FIG. 4 shows an example of a portion of a memory card, for example a DIMM (Dual Inline Memory Module) 410 carrying a set of DDR3 DRAM memory chips 412-1, 412-2 to which the present invention may be applied. In the example of FIG. 4, the DIMM is built on a printed circuit board 414 with a set of interconnection pins 416 to interface the DIMM with a socket for power, control and data signals. The interconnection wire lines on the board 414 are not shown in order to simplify the drawing. Each DIMM includes an advanced memory buffer 418 to interface data and control signals between the connection pins and the DRAM chips. It also has a DIMM controller 420 to perform supervisory and diagnostic functions for the DIMM.

Each DRAM includes an addressing multiplexer and demultiplexer 422 to provide access to the array of memory banks 424 on the chip. A DRAM controller 426 provides control and diagnostic functions on the die. The calibration circuitry described above may be contained within and operated by the DRAM controller or in a different module of the DRAM.

Figure 5:
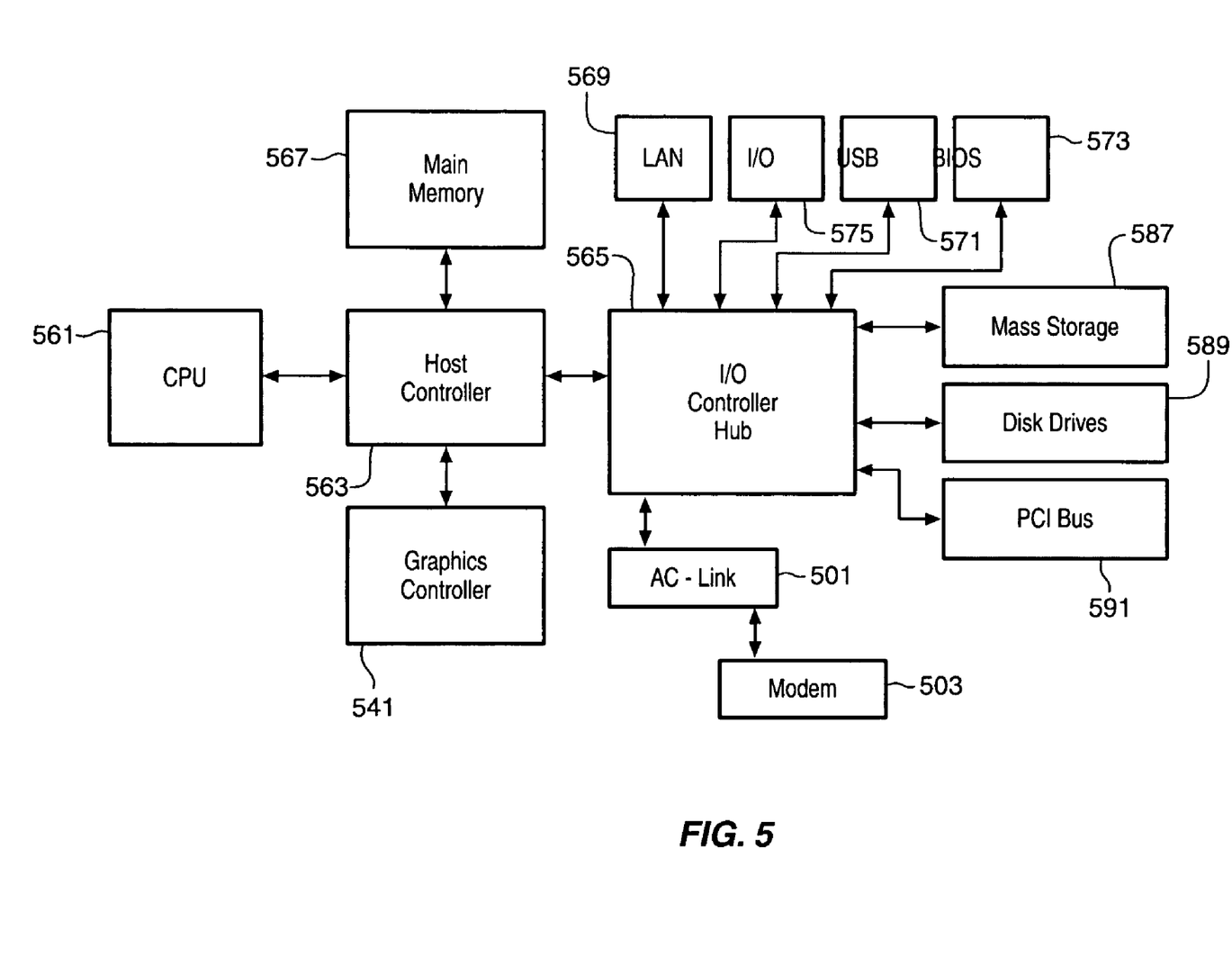
FIG. 5 is a block diagram of a computer system suitable for use with some embodiments of the present invention.

The calibration operations described above may be performed autonomously within the DRAM under the control of the DRAM controller 426, the DIMM controller 420 or a separate controller, such as a memory controller hub (see FIG. 5). Other controllers may alternatively be used depending upon the particular application.

FIG. 5 shows a computer system suitable for use with a memory or other IC's as described above. While embodiments of the present invention are described in the context of a system memory, such as the main memory 567 shown in FIG. 5, embodiments of the present invention may be adapted for application on a great number of different ICs. Such ICs include most of the circuits shown and described in the context of FIG. 5. In the example of FIG. 5, the computer system may include a CPU (Central Processing Unit) 561 coupled to a Host Controller 563, for example a MCH (Memory Controller Hub) chip. The MCH chip functions as part of a supporting chipset for the CPU and the main memory. The MCH chip is coupled to main memory 567, such as DDR3 DRAM and to an optional graphics controller 541.

The MCH chip 563 is also coupled to an ICH (Input/Output controller hub) chip 565. The ICH chip offers connectivity to a wide range of different devices. Well-established conventions and protocols may be used for these connections. The connections may include a LAN (Local Area Network) port 569, a USB (Universal Serial Bus) hub 571, and a local BIOS (Basic Input/Output System) flash memory 573. A SIO (Super Input/Output) port 575 may provide connectivity for a keyboard or other input devices.

The ICH may also provide an IDE (Integrated Device Electronics) bus for connections to disk drives 587, 589 or other large memory devices. The mass storage may include hard disk drives and optical drives. So, for example, software programs, user data, and data files may be stored on a hard disk drive or other drive. In addition CD's (Compact Disk), DVD's (Digital Versatile Disk) and other storage media may be played on drives coupled to the IDE bus.

A PCI (Peripheral Component Interconnect) bus 591 is coupled to the ICH and allows a wide range of devices and ports to be coupled to the ICH, such as network and video adapter cards. There are many more devices available for connection to a PCI port and many more possible functions. The PCI devices may also allow for wired or wireless connections to more remote equipment or any of a number of different interfaces. The remote equipment may allow for communication of programming data, for maintenance or remote control or for gaming, Internet surfing or other capabilities.

Figure 6A:
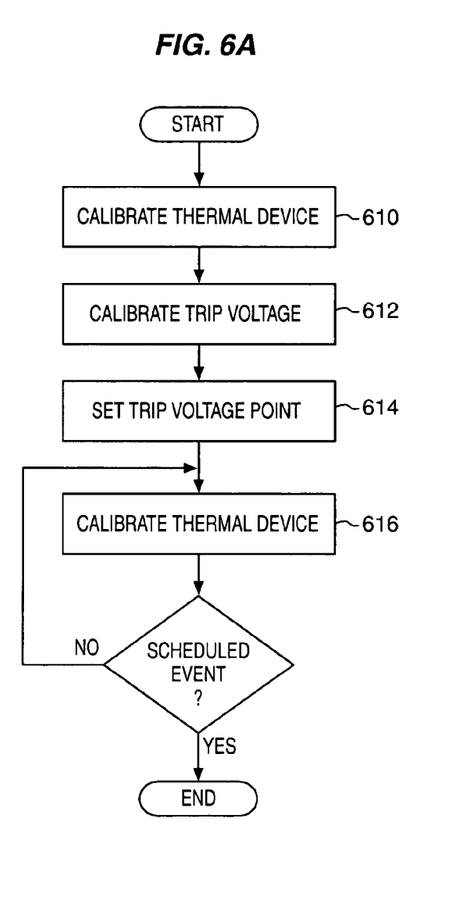
FIG. 6A shows a process for configuring and regulating thermal management for a semiconductor die according to an embodiment of the invention.
Figure 6B:
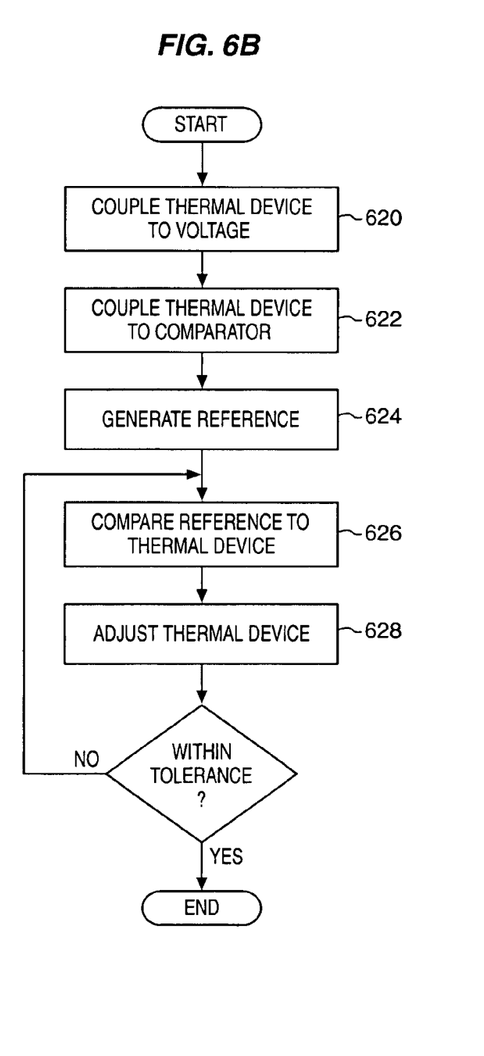
FIG. 6B shows a process for calibrating a thermal device according to an embodiment of the invention.
Figure 6C:
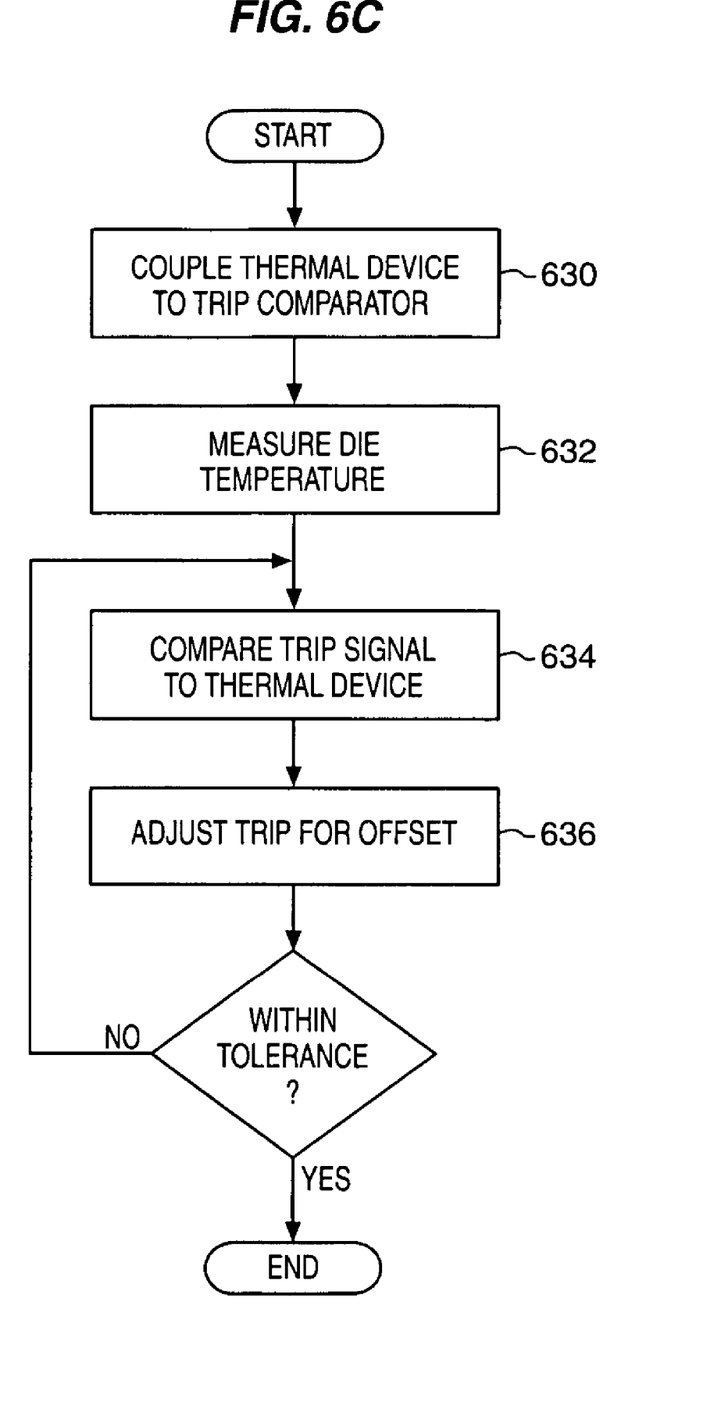
FIG. 6C shows a process for calibrating a trip voltage of a thermal management system according to an embodiment of the invention.

The configurations described above may be applied to a calibration methodology as suggested by FIGS. 6A, 6B, and 6C. In FIG. 6A different primary operations are set forth. The particular order of operations may be modified to suit any particular application and some of the operations may be deleted while additional operations may be added. The first operation 610 in FIG. 6A is to calibrate the thermal device, for example diode 110, as described in more detail with respect to FIG. 6B. This calibration may be performed at a manufacturing or testing facility or by an end user. The second operation 612 in FIG. 6A is to calibrate the trip voltage, by for example determining a manufacturing offset. This operation is described in more detail with respect to FIG. 6C. In some embodiments, the trip voltage may be calibrated more accurately if the thermal device is already calibrated.

The third operation 614 of FIG. 6A is to set the trip voltage point. This may be preset, selected by a manufacturer or selected by a user. The fourth operation 616 of FIG. 6A is to calibrate the thermal device again. This may be the same operation as the first operation 610. This calibration may be performed by a user or autonomously driven by a controller or processor on or near the die. The fourth operation may be repeated at regular intervals to compensate for changes in the die's environment and changes in the physical properties of the die that may occur over time.

Referring to FIG. 6B, the thermal device may be calibrated as described above with respect to FIG. 3. In the example of FIG. 3, the thermal device included several pull-down legs that may be switched on and off to modify the effective area of the p-n junction of the thermal diode 110. Such a calibration may begin at block 620 with coupling the thermal device to a high voltage. In the example of FIG. 3, the sources of the pull-down legs are coupled through the ZQ pin to VDD through a precision resistor that is external to or integrated on the die. At block 622, the thermal device is also coupled to a calibration comparator, such as the comparator 310 of FIG. 3. This connection is switchable in one embodiment, so that the thermal device is coupled to one comparator for calibration purposes and to another comparator for regular use.

At block 624 a reference voltage is generated for comparison purposes, such as a divided version of VDD and at block 626, this voltage is compared to the thermal device's temperature voltage output. At block 628, the thermal device is adjusted. In the example of FIG. 3, this adjustment is performed by receiving either an up or down signal from the comparator and applying it to enable or disable a leg of the thermal device. The comparison 626 and adjustment 628 may be repeated one leg at a time until a sufficient accuracy is achieved. For example, the comparison and adjustment may be repeated until each change reverses the comparator output from up to down. At that point, the system's maximum accuracy has been reached.

While the thermal device calibration is described in the context of FIG. 3, this is only one example of a thermal device and a methodology that may be used for such a calibration operation. A similar result may be achieved by adjusting the trip voltage for thermal device errors as shown in FIG. 1.

In FIG. 6C, the trip voltage is calibrated. This may be done by adjusting the thermal diode as shown for example in FIG. 3 or by adjusting the trip signal generator as shown for example in FIG. 1. Using the example of FIG. 1, at block 630 the thermal device is coupled to a trip voltage comparator, such as comparator 114 of FIG. 1. At block 632, the die temperature is measured. This may be done by an external measurement of the package or a probe that measures temperature on or in the die. At block 634, the voltage of the trip signal at a known temperature is compared to the voltage of the thermal device at that temperature.

Based on this comparison, at block 636, the trip voltage may be adjusted for any offset between the two voltages. In the example of FIG. 1, this is done by enabling or disabling pull-down legs of the trip voltage generator. The comparison 634 and adjustment 636 may be repeated until the desired accuracy is obtained. The trip voltage calibration may be used to compensate for manufacturing variations in the trip voltage generation devices. It may also be used to compensate for any other desired factors.

With a calibrated relationship between the trip voltage and the temperature of the die, the trip voltage may be set (block 614) so that the trip signal is generated at any selected temperature. As shown in Table 1, each leg of the trip voltage generator changes the trip voltage so that the trip voltage will correspond to a different temperature. Any one of the available temperatures may be selected by enabling or disabling the appropriate ones of the pull-down legs. This allows the trip signal to be generated at precisely the desired temperature. In one embodiment, the manufacturer selects the trip voltage point to ensure the safety of the die. In another embodiment, the user may modify the manufacturer's setting or select a unique voltage based on the user's own needs.

It is to be appreciated that a lesser or more equipped push-pull network, calibration circuit, thermal sensing device, memory system, and computer system than the examples described above may be preferred for certain implementations. Therefore, the configurations may vary from implementation to implementation depending upon numerous factors, such as price constraints, performance requirements, technological improvements, or other circumstances. Embodiments of the invention may also be applied to other types of systems that use different hardware architectures than that shown in the Figures.

Embodiments of the present invention may be provided as a computer program product which may include a machine-readable medium having stored thereon instructions which may be used to program a computer system (or other electronic devices) to perform a process according to embodiments of the present invention. The machine-readable medium may include, but is not limited to, floppy diskettes, optical disks, CD-ROMs, and magneto-optical disks, ROMs, RAMs, EPROMs, EEPROMs, magnet or optical cards, flash memory, or other type of media/machine-readable medium suitable for storing electronic instructions. Moreover, embodiments of the present invention may also be downloaded as a computer program product, wherein the program may be transferred from a remote computer to a requesting computer by way of data signals embodied in a carrier wave or other propagation medium via a communication link (e.g., a modem or network connection).

In the description above, for purposes of explanation, numerous specific details are set forth in order to provide a thorough understanding of embodiments of the present invention. It will be apparent, however, to one skilled in the art that embodiments of the present invention may be practiced without some of these specific details. In other instances, well-known structures and devices are shown in block diagram form.

Embodiments of the present invention may include various operations. The operations of embodiments of the present invention may be performed by hardware components, such as those shown in the Figures, or may be embodied in machine-executable instructions, which may be used to cause general-purpose or special-purpose processor or logic circuits programmed with the instructions to perform the operations. Alternatively, the operations may be performed by a combination of hardware and software.

Many of the methods and apparatus are described in their most basic form but operations may be added to or deleted from any of the methods and components may be added or subtracted from any of the described apparatus without departing from the basic scope of the present claims. It will be apparent to those skilled in the art that many further modifications and adaptations may be made. The particular embodiments are not provided as limitations but as illustrations. The scope of the claims is not to be determined by the specific examples provided above but only by the claims below.

The invention claimed is:

1. An apparatus comprising:
a semiconductor die;
a thermal sensor thermally coupled to the die to sense the temperature of the die and generate an output representing the sensed temperature; and
an adjustable compensation circuit coupled to the thermal sensor to compensate the thermal sensor output.

2. The apparatus of claim 1, wherein the compensation circuit generates an adjustable threshold signal, and wherein the thermal sensor comprises a comparator to compare the thermal sensor output to the threshold signal.

3. The apparatus of claim 1, wherein the compensation circuit comprises a push-pull network to generate an adjustable threshold voltage and wherein the thermal sensor comprises a comparator to compare the threshold voltage to the thermal sensor output.

4. The apparatus of claim 3, wherein the push-pull network comprises a sequence of controllable transistor pull-down legs.

5. The apparatus of claim 1, wherein the compensation circuit comprises a push-pull network of the thermal sensor with a plurality of legs to adjust the effective thermal junction of the network.

6. The apparatus of claim 5, wherein the thermal sensor output comprises the junction voltage of the adjustable thermal junction.

7. The apparatus of claim 6, further comprising a calibration circuit to compare the sensor output to a reference voltage and to adjust the effective thermal junction of the push-pull network based on the comparison.

8. The apparatus of claim 7, wherein the calibration circuit adjusts the effective thermal junction by alternately enabling and disabling legs of the push-pull network.

9. The apparatus of claim 1, further comprising a controller on the semiconductor die to drive calibration cycles using the adjustable compensation circuit.

10. The apparatus of claim 1, wherein the semiconductor die comprises a memory chip.

11. A memory system comprising:
a plurality of memory cells on a semiconductor die;
a buffer on the semiconductor die to interface between the memory cells and an external agent;
a thermal sensor thermally coupled to the semiconductor die to sense the temperature of the die and generate an output representing the sensed temperature; and
an adjustable compensation circuit coupled to the thermal sensor to compensate the thermal sensor output.

12. The system of claim 11, further comprising a controller coupled to the adjustable compensation circuit to drive a compensation cycle by the compensation circuit.

13. The system of claim 11, wherein the compensation circuit generates an adjustable threshold signal, and wherein the thermal sensor comprises a comparator to compare the thermal sensor output to the threshold signal.

14. The system of claim 11, wherein the compensation circuit comprises a push-pull network to generate an adjustable threshold voltage and wherein the thermal sensor comprises a comparator to compare the threshold voltage to the thermal sensor output.

15. The system of claim 14, wherein the calibration circuit adjusts the effective thermal junction of the thermal device by alternately enabling and disabling legs of a push-pull network.

16. A computer system comprising:
a processor; and
a system memory coupled to the processor, the system memory having a semiconductor die, a thermal sensor thermally coupled to the die to sense the temperature of the die and generate an output representing the sensed temperature, and an adjustable compensation circuit coupled to the thermal sensor to compensate the thermal sensor output.

17. The system of claim 16, wherein the compensation circuit comprises a circuit to generate an adjustable threshold voltage and wherein the thermal sensor comprises a comparator to compare the threshold voltage to the thermal sensor output.

18. The system of claim 16, wherein the compensation circuit comprises a circuit to adjust the effective thermal junction of a push-pull network.

19. A method comprising:
coupling a thermal device integrated on a semiconductor die to a known voltage;
comparing a thermal voltage output of the thermal device to a reference voltage; and
switching pull-down legs of a push-pull network based on the comparison.

20. The method of claim 19, wherein coupling the thermal device to a known voltage comprises coupling the thermal device to a known external voltage through an external precision resistor.

21. The method of claim 20, wherein switching pull-down legs comprises switching pull-down legs of the thermal device to adjust the thermal voltage output of the thermal device.

22. The method of claim 19, wherein switching pull-down legs comprises switching pull-down legs of a reference voltage circuit to adjust the reference voltage.

23. An article comprising a machine readable medium including data that when accessed by a machine causes the machine to perform operations comprising:
coupling a thermal device integrated on a semiconductor die to a known voltage;
comparing a thermal voltage output of the thermal device to a reference voltage; and
switching pull-down legs of a push-pull network based on the comparison.

24. The article of claim 23, wherein the data causing the machine to switch pull-down legs comprises data causing the machine to perform further operations comprising switching pull-down legs of the thermal device to adjust the thermal voltage output of the thermal device.

25. The article of claim 23, wherein the data causing the machine to switch pull-down legs comprises data causing the machine to perform further operations comprising switching pull-down legs of the of a reference voltage circuit to adjust the reference voltage.

* * * * *